United States Patent
Hu et al.

(10) Patent No.: US 6,833,289 B2
(45) Date of Patent: Dec. 21, 2004

(54) FLUXLESS DIE-TO-HEAT SPREADER BONDING USING THERMAL INTERFACE MATERIAL

(75) Inventors: Chuan Hu, Chandler, AZ (US); Daoqiang Lu, Chandler, AZ (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 10/436,677

(22) Filed: May 12, 2003

(65) Prior Publication Data

US 2004/0227229 A1 Nov. 18, 2004

(51) Int. Cl.[7] .............................................. H01L 21/50
(52) U.S. Cl. ...................................... 438/121; 438/122
(58) Field of Search .......................... 257/713; 438/106, 438/122, 118, 584, 121

(56) References Cited

U.S. PATENT DOCUMENTS

| 6,471,115 B1 | 10/2002 | Ijuin et al. |
| 6,495,397 B2 | 12/2002 | Kubota et al. |
| 6,559,536 B1 * | 5/2003 | Katoh et al. ................. 257/712 |

* cited by examiner

*Primary Examiner*—Roy Potter
(74) *Attorney, Agent, or Firm*—Marger Johnson & McCollom, P.C.

(57) ABSTRACT

A thinned semiconductor die is coupled to an integrated heat spreader with thermal interface material to form a semiconductor package. The method for forming the package comprises forming a metallization layer on a backside of a thinned semiconductor die. A thermal interface portion, including a solder layer including a fluxlessly-capable solder such as AuSn, is formed on the topside of the integrated heat spreader. The metallization layer and the solder layer are then forced together under load and heat without flux to bond the semiconductor die to the integrated heat spreader.

16 Claims, 4 Drawing Sheets

FLUXLESS DIE-TO-HEAT SPREADER BONDING USING THERMAL INTERFACE MATERIAL

BACKGROUND OF THE INVENTION

This invention relates generally to semiconductor device manufacturing, and more particularly to methods and structures for transmitting heat away from semiconductor dies using conductive heat spreaders.

Semiconductor circuit processing has seen a dramatic improvement in lithography that allows semiconductor manufacturers to shrink the size of circuits formed on wafers. This shrinkage has a cost advantage for the manufacturer in that circuit density is increased because more circuits can be formed within a given area of a wafer surface. A known drawback to increased circuit density, however, is an increased need for power dissipation. Semiconductor circuits are not perfect conductors and their operation necessarily generates a lot of heat caused by a resistance to the electricity running through the circuits. The amount of heat generated within a given area increases as circuit density increases. Heat buildup within the circuit can cause failures. Accordingly, more complicated power dissipation schemes have been developed to draw heat away from the circuits that generate it.

One known method for addressing this power dissipation problem is to use an integrated heat spreader (IHS). In these known systems, an IHS is coupled to a semiconductor die using a thermal interface material (TIM) so that heat generated within the die is conducted through the TIM and thence to the IHS where it is then radiated away from the die. Current state of the art processes for bonding the IHS to the die involve using a flux and soft solder preform around 200 μm as the thermal interface material. These methods have severe limitations, however, as circuit size decreases and circuit density increases. Both full thickness silicon die (~775 microns) and the thick solder TIM (~200 microns) contribute significantly to the total thermal barrier and thus increase the junction temperature and lower reliability. Soft solder-based thermal interface materials cannot bond the die to the IHS reliably if the TIM thickness is small. Furthermore, TIM bonding with fluxes generates voids thereby causing reliability issues. And although fluxless bonding methods are known, these known methods have low throughput and involve high costs thus making them unsuitable to high volume semiconductor manufacturing.

Accordingly, the need exists for an alternate method for bonding dies to integrated heat spreaders that overcomes the drawbacks of known prior art methods.

DETAILED DESCRIPTION

The invention is particularly directed to, although not limited by, use with thinned semiconductor dies. Semiconductor dies are formed on a wafer where many dies are formed on a single wafer. As wafers become larger—current state of the art manufacturing uses wafers having diameters of 300 mm (~12")—more dies can be formed at once. The drawback to larger wafers is that thickness is increased. In the past when wafers were 3" in diameter, thicknesses were on the order of 300–400 μm. With 12" wafers, the thicknesses are 770 μm. Current uses such as in cell phones and laptop computers require much smaller form factors, on the order of 50 to 150 μm. Accordingly, it is desirable to thin the semiconductor die backside to reduce the thickness of the die and therefore the thickness of the entire package.

Figure 6:
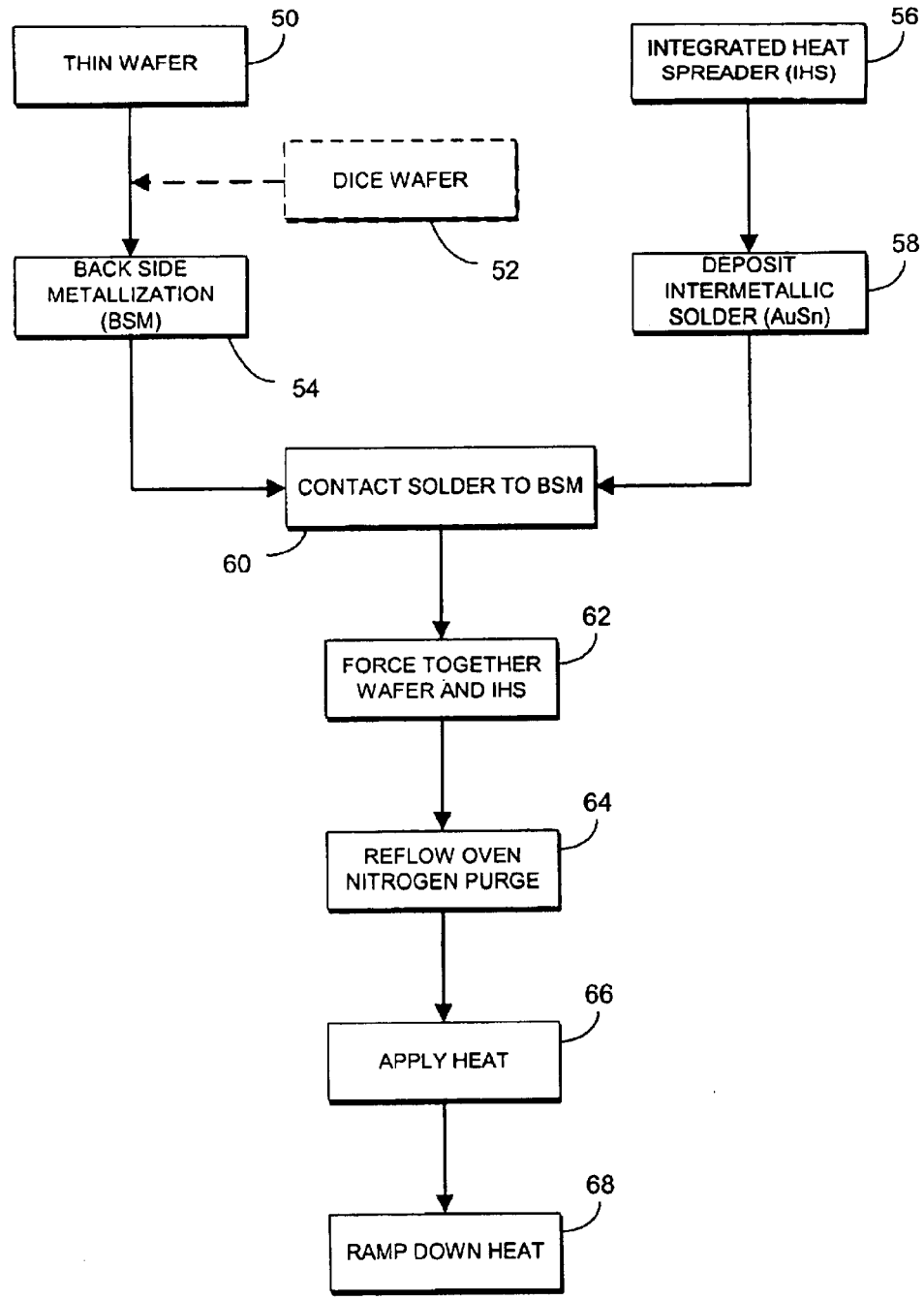
FIG. 6 is a flow diagram illustrating a preferred process for bonding a thinned die with an IHS to yield the structure shown in FIG. 4.

Discussion will proceed with reference to the preferred method for bonding the die to the integrated heat sink (IHS) as shown in the flow diagram of FIG. 6.

The wafer or die is thinned in block 50 to between about 50 to 150 μm. The wafer can be diced during the thinning process or after thinning in block 52. Several methods have been proposed for thinning the semiconductor die. Although the bonding process of the package according to the present invention is not limited to the following methods, such are disclosed here for interest. In a first wafer-thinning process, thinning is carried out by back grinding using a rough grind, fine grind, and finally a polishing process. Such a process typically includes supporting the die on a rigid carrier substrate (e.g. transparent glass) by adhesive film (UV sensitive epoxy) to prevent breakage and warpage of the thinned wafer. In a second process, thinning is achieved by dry-etching using $SF_6$ as an etching gas.

Figure 1:
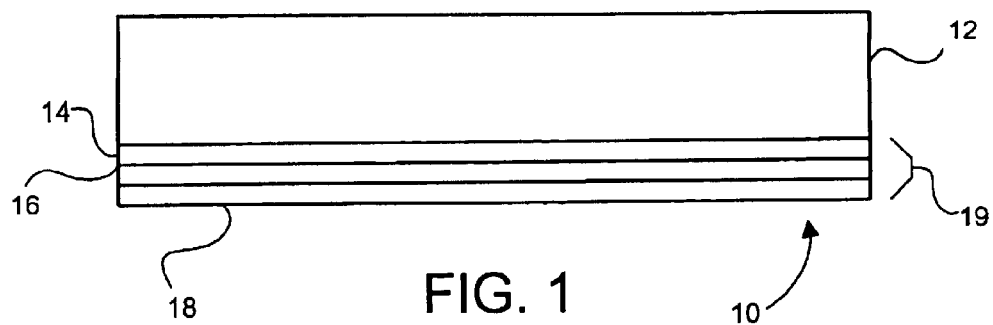
FIG. 1 is a cross-section of a thinned semiconductor wafer die with backside metallization (BSM) deposited on a lower surface of the die according to a preferred embodiment of the invention.

A back side metallization (BSM) process is performed on the thinned die in block 54 to form the device shown at 10 in FIG. 1. The wafer die is shown at 12 with the metallized layers shown collectively at 19. The semiconductor die 12 includes a front side and an to opposed backside with the metallized layers 19 formed on the backside. Each of these layers can be deposited on a backside of the die 12 using sputtering, evaporization, e-beam, plating, or other known deposition methods. The backside metallization layers 19 preferably include three layers including an adhesion/barrier layer 14, a wetting layer 16, and a protection layer 18 with each layer having a thickness of approximately 1 μm, 3.6 μm, and 1 μm, respectively. The adhesion/barrier layer 14 is preferably formed of titanium (TI) although other materials are possible such as titanium-nitride (TiN), tantalum (Ta) and tantalum-nitride (TaN). The wetting layer 16 is preferably formed of nickel-vanadium (NiV) but nickel (Ni) may also be used. The protection layer 18 is preferably formed of gold (Au) although platinum (Pt) and palladium (Pd) may also be used.

Figure 2:
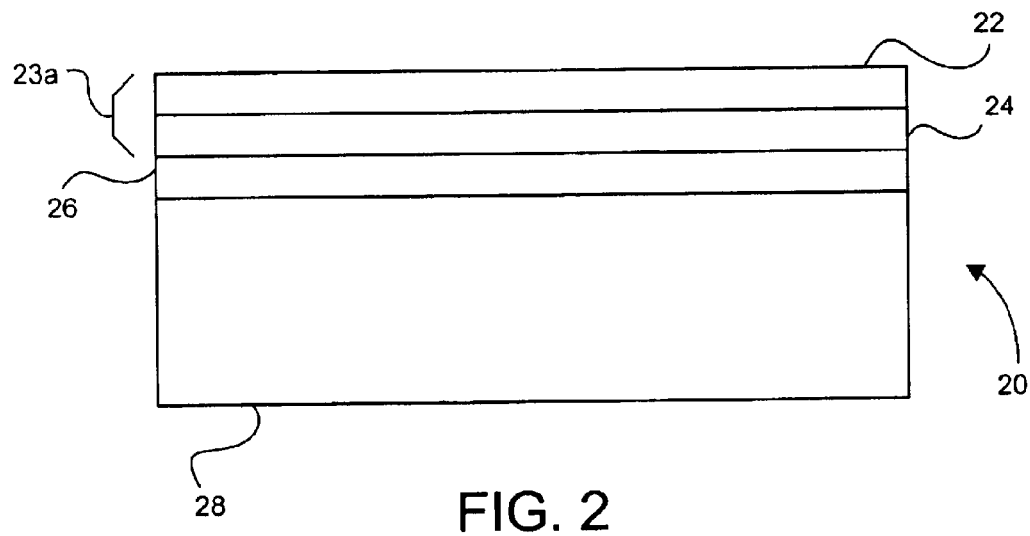
FIG. 2 is a cross-section of an integrated heat sink (IHS) treated with multi-layer intermetallic solder components according to a preferred embodiment of the invention.

Turning back to FIG. 6, a parallel process path is performed for the formation of integrated heat spreader (IHS)

in block 56. Integrated heat spreaders by themselves are well-known devices, typically encompassing a metallic black body radiator having a high surface area component to maximize its radiant capacity. Bonding of the IHS 28 with the die 12 according to the present invention, however, requires a thermal interface with the die as discussed herein. A thermal interface including a fluxlessly-capable solder portion is deposited on a top surface of the IHS. As shown in FIG. 2, IHS 28 has formed on a top surface a series of layers in block 58 to form an device 20 including solder component layers 22, 24 and 26. The approximate thickness of each layer is about 3 $\mu$m. The true thickness of the solder layers 22, 24 should preferably be designed so that the overall ratio of the two materials approximates the weight ratios of a eutectic alloy. Since the protective layer 18 of the BSM 19 also plays a part in the bonding process, it is preferred that the amount of material there also be taken into consideration to yield a eutectic alloy.

The thermal interface material (TIM) includes a solder portion 23a preferably formed with gold (Au) and tin (Sn) in an approximate ratio by weight of 80 to 20. The solder TIM should meet two criteria: high strength and fluxless solderability. AuSn is the preferred material because it has been found to have the highest strength among solders and it is suitable for flux less bonding. Other solder materials may also work as long as they meet the above two criteria.

Figure 3:
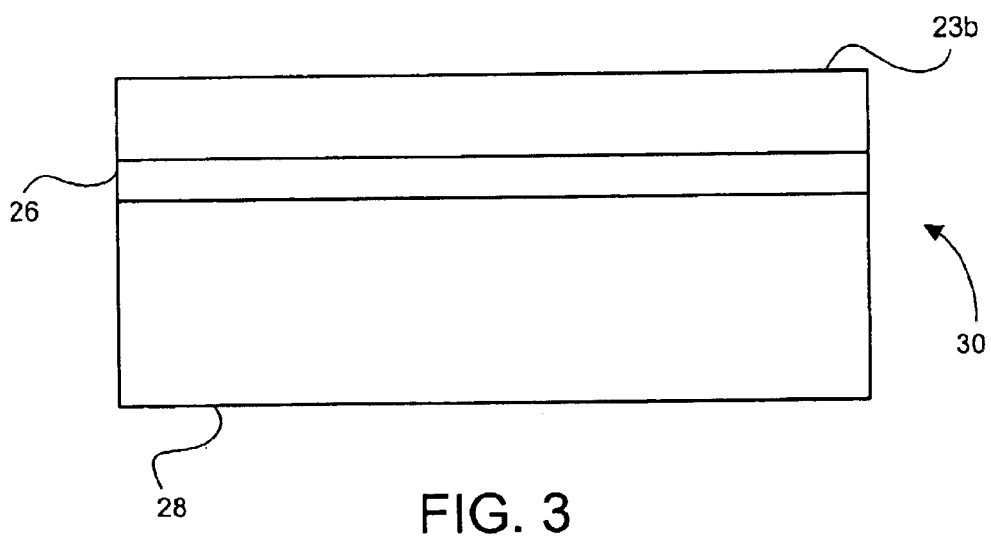
FIG. 3 is a cross-section view of an integrated heat sink (IHS) treated with multi-layer intermetallic solder components according to an alternate embodiment of the invention.

An alternate deposition arrangement of the TIM onto the IHS is shown at 30 in FIG. 3. Eutectic AuSn solder, shown in FIG. 3 as solder component layer 23b and defined as having a melting point that is lower than an alloy made of the same materials but in different weight ratios, is used as the solder TIM where the single eutectic AuSn layer is an alloy of an approximate 80%:20% weight ratio. The solder portion thus includes, as in FIG. 2, separate Au and Sn layers (24 and 22, respectively) or a single eutectic AuSn layer 23b as in FIG. 3. A barrier layer 26 of nickel (Ni) is generally required. The solder can be deposited by plating, sputtering, or other methods.

Figure 4:
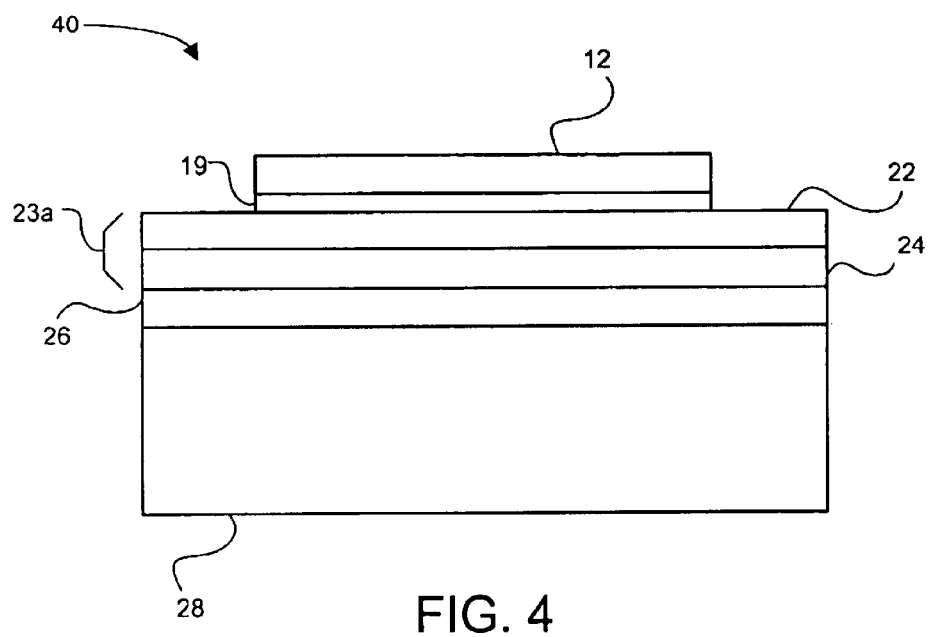
FIG. 4 is a cross-section of a semiconductor package formed of bonded components from FIGS. 1 and 2 according to a preferred embodiment of the invention.

Once the wafer die 12 with back side metallization 19 is formed as shown in FIG. 1 and the integrated heat spreader 28 with deposited intermetallic solder layers 23a or 23b (FIGS. 2 and 3, respectively), the thinned die device 10 is placed onto HIS device 20 (or 30) to yield the assembly shown at 40 in FIG. 4. Assembly 40 is arranged in block 60 (FIG. 6) so that the BSM layers 19 contact the solder layer 23a of the IHS 28. The metallization layer 19 and solder layer 23a are forced together under load and heat in the absence of a flux in order to bond the semiconductor die to the integrated heat spreader.

Figure 5:
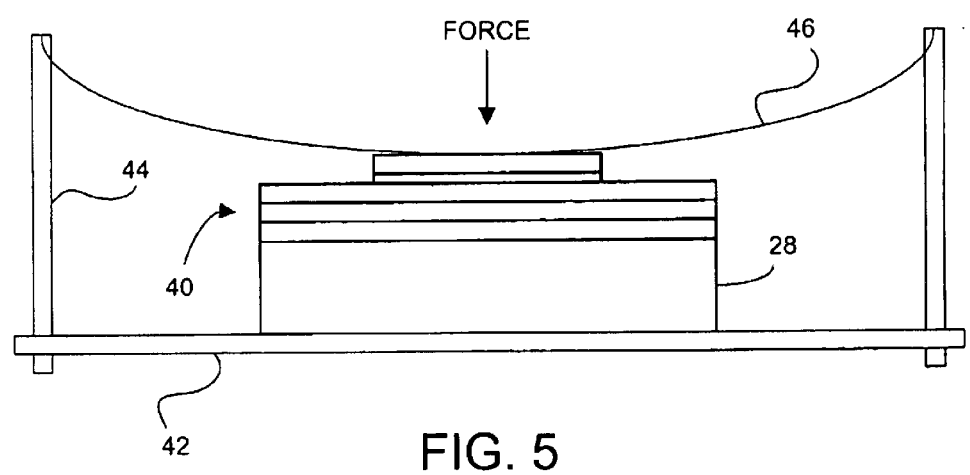
FIG. 5 is a schematic illustration of the semiconductor package of FIG. 4 bonded under force according to one implementation of the invention.

One example of applying a bonding force to the assembly 40 is shown in FIG. 5. The assembly 40 is placed on a carrier 42 and a clip 46 having a concave bend to it is attached between two posts 44 in order to apply a force onto the top of assembly 40 where the die 12 is located. Other approaches to bonding the assembly 40 under force can be implemented and the present invention is not intended to be limited to the specific approach described above.

Figure 7:
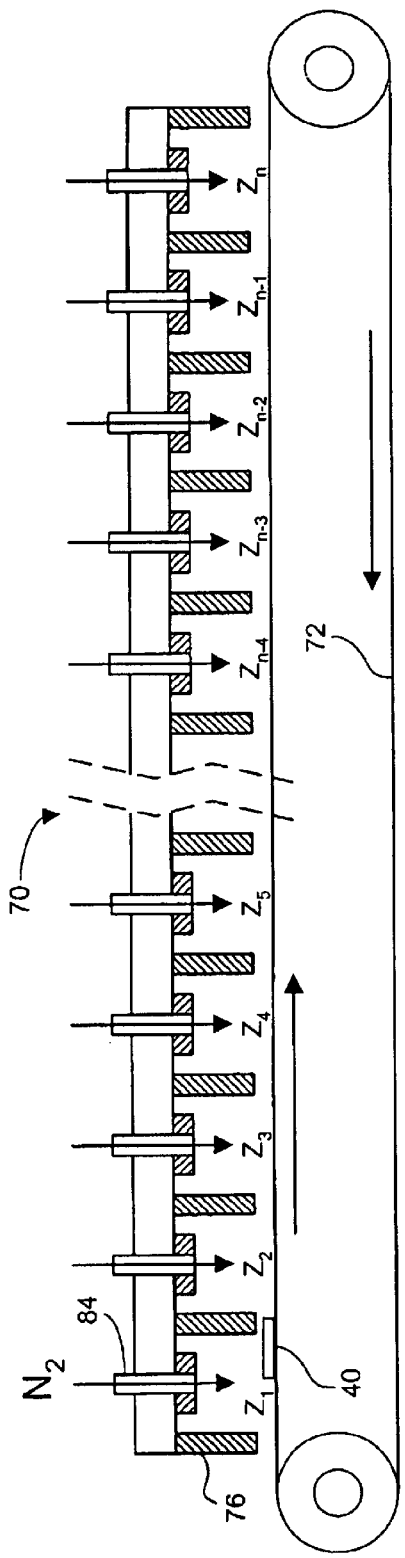
FIG. 7 is a schematic illustration showing an exemplary multi-zone reflow oven used to process the device of FIG. 6 under heat to yield the bonded structure shown in FIG. 4.

FIG. 7 illustrates a reflow oven 70 of a type preferably used to apply heat to the assembly 40 according to the invention. The assembly 40, now including the clip mechanism shown in FIG. 5, sits on a conveyor belt 72 and is moved sequentially through multiple heating zones $Z_1$ to $Z_n$.

Figure 8:
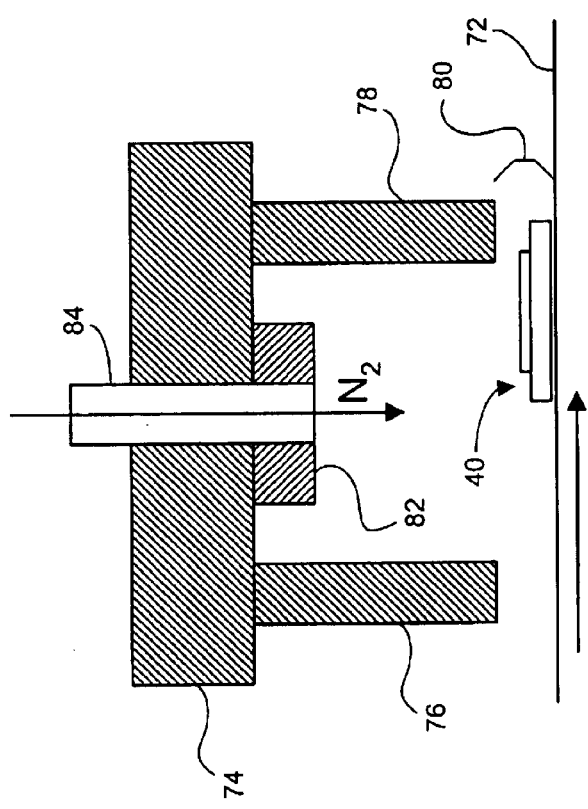
FIG. 8 is a schematic illustration showing a single oven unit of the multi-zone reflow oven shown in FIG. 7.

FIG. 8 shows a single one of these zones. Each zone includes a chamber 73 bounded on three sides by insulated walls including a top wall 74, and zone separator walls 76 and 78. The chamber 73 is bounded on the fourth side by conveyor belt 72. Zone separator walls 76, 78 extend downward from the top wall 74 to just above the surface of conveyor belt 72. This forms an opening 80 between the walls and the conveyor belt. The opening is sized so that the assembly 40 can just pass through the opening but that heat bleed from adjacent zones is minimized. A heating element 82 such as resistive heating coils are affixed to an underside of wall 74 and within the chamber to provide radiative heat to assembly 40 passing within the chamber beneath the element. The radiative heat element should be capable of heating the chamber to at least 400° C. to achieve full control of the temperature parameters specified in the preferred method. An air passage 84 passes through wall 74 to admit a gas into chamber 73 a described below.

The oven 70 is purged preferably with nitrogen gas ($N_2$) in block 64 as part of the heat treatment process. The thermal insulating material including the solder portion 23a is heated within the oven to above about 300° C. for between 1 and 30 minutes, but preferably between about 2 and 3 minutes. Once heated to the desired temperature, the assembly 40 is moved to different heating zones within reflow oven 70 to apply a controlled cooling down process (block 68 in FIG. 6). The temperature is preferably ramped down lower than about 100° C. per minute and most preferably about 30° C. per minute.

The time that the assembly 40 spends in each zone is dictated by the width of the zone and the speed of the conveyor belt. Each zone can be maintained at specific temperatures and the belt speed can be controlled so that the assembly 40 is heated and cooled for the proper time periods. As an example, zone $Z_1$ through $Z_3$ can be heated by coils 82 within each zone to 300° C. Zone $Z_4$ can be heated to 270° C., zone $Z_5$ to. 240° C., and each successive zone to 30° C. less than the previous zone, with the last zone $Z_n$ set to 30° C., until the assembly emerges out the last zone to ambient temperature. The conveyor belt speed is set to that any particular point on the belt 72 traverses a zone in one minute. In this arrangement, assembly 40 would spend a total of three minutes in zones heated to 300° C., and then pass through successive zones that are 30° C. cooler than the previous one so that the assembly is cooled approximately 30° C. per minute. Temperature control of each zone will be more independent by minimizing lateral thermal transfer between adjacent zones. This is realized by using better thermally insulating zone separator and smaller gap between the separator and belt. The reflow oven will provide more flexible heating up and cooling down.

Having described and illustrated the principles of the invention in a preferred embodiment thereof, it should be apparent that the invention can be modified in arrangement and detail without departing from such principles. I claim all modifications and variation coming within the spirit and scope of the following claims.

What is claimed is:

1. A method for forming a semiconductor package having a semiconductor die coupled to an integrated heat spreader, the method comprising:

forming a metallization layer on a backside of the semiconductor die;

forming a thermal interface portion on a topside of the integrated heat spreader, said thermal interface portion including a solder layer; and forcing together under load and heat the metallization layer and the solder layer without flux to bond the semiconductor die to the integrated heat spreader.

2. The method of claim 1, further including heating the package to above 300° C. for a package heating time of between about 1 and 30 minutes and ramping down the temperature lower than about 100° C. per minute.

3. The method of claim 2, wherein the package heating time is between about 2 and 3 minutes.

4. The method of claim 2, wherein the temperature is ramped down approximately 30° C. per minute.

5. The method of claim 1 further including reacting the solder layer with the metallization layer to form bonded intermetallic layers.

6. The method of claim 5, wherein the solder layer includes gold (Au) and tin (Sn) and the metallization layer includes a protection layer formed of a material selected from the group consisting of gold (Au), Platinum (Pt), and Palladium (Td) and a wetting layer formed of a material selected from the group consisting of nickel-vanadium (NiV) and nickel (Ni).

7. The method of claim 6, wherein the solder layer reacts with the protection layer and wetting layer to form intermetallics using a fluxless bonding approach.

8. The method of claim 7, wherein the solder layer includes gold (Au) and tin (Sn), the protection layer is gold (Au) and the wetting layer is nickel Ni) where the intermetallic formed is Au—Sn—Ni.

9. The method of claim 1 wherein the metallization layer includes an adhesion/barrier layer, a wetting layer, and a protection layer.

10. The method of claim 1, further including bonding the die of the semiconductor package onto an organic printed circuit board substrate.

11. The method of claim 1 wherein forcing the metallization layer and fluxless solder layer together under load and heat includes placing the package within a reflow oven purged with $N_2$.

12. The method of claim 1 wherein the step of forcing the metallization layer and fluxless solder layer together under load and heat further includes:

resting the integrated heat spreader on a carrier with the fluxlessly-capable solder layer exposed;

placing the die on top of the integrated heat spreader with the metallization layer in contact with the fluxlessly-capable solder layer;

holding the die onto the integrated heat spreader using a downward force on the package; and heating the package within a reflow oven purged with $N_2$.

13. The method of claim 12, wherein the downward force includes a clip holding the die onto the integrated heat.

14. The method of claim 12, further including ramping down the heat applied to the 2 package after heating the package.

15. The method of claim 12, wherein the reflow oven used for heating the package includes multiple zones each with independent temperature controls.

16. The method of claim 15, said reflow oven multiple zones have a maximum temperature of 400° C.

* * * * *

UNITED STATES PATENT AND TRADEMARK OFFICE
CERTIFICATE OF CORRECTION

PATENT NO.    : 6,833,289 B2
DATED         : December 21, 2004
INVENTOR(S)   : Hu et al.

It is certified that error appears in the above-identified patent and that said Letters Patent is hereby corrected as shown below:

Column 5,
Line 14, replace "Palladium (Td) and" with -- Palladium (Pd) and --.
Line 22, replace "nickel Ni)" with -- nickel (Ni) --.

Column 6,
Line 21, replace "to the 2 package" with -- to the package --.

Signed and Sealed this

Seventh Day of February, 2006

JON W. DUDAS
*Director of the United States Patent and Trademark Office*